US011709751B2

(12) United States Patent
Takei et al.

(10) Patent No.: US 11,709,751 B2
(45) Date of Patent: Jul. 25, 2023

(54) INSTALLATION DEVICE AND INSTALLATION METHOD

(71) Applicant: Nippon Telegraph and Telephone Corporation, Tokyo (JP)

(72) Inventors: Yuki Takei, Tokyo (JP); Satoshi Nishiyama, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 427 days.

(21) Appl. No.: 16/972,121

(22) PCT Filed: May 24, 2019

(86) PCT No.: PCT/JP2019/020775
§ 371 (c)(1),
(2) Date: Dec. 4, 2020

(87) PCT Pub. No.: WO2019/235271
PCT Pub. Date: Dec. 12, 2019

(65) Prior Publication Data
US 2021/0232477 A1    Jul. 29, 2021

(30) Foreign Application Priority Data

Jun. 6, 2018  (JP) ................................ 2018-108254

(51) Int. Cl.
*G06F 11/34* (2006.01)
*G06N 20/00* (2019.01)
*G06F 30/33* (2020.01)

(52) U.S. Cl.
CPC ...... *G06F 11/3409* (2013.01); *G06F 11/3466* (2013.01); *G06F 30/33* (2020.01); *G06N 20/00* (2019.01)

(58) Field of Classification Search
CPC ............. G06F 11/3409; G06F 11/3419; G06F 11/3423; G06F 11/3466; G06F 11/3452; G06F 30/33; G06F 9/50; G06N 20/00
(Continued)

(56) References Cited

U.S. PATENT DOCUMENTS

2012/0131180 A1 * 5/2012 Nomura ................ G06F 9/5077
709/224

FOREIGN PATENT DOCUMENTS

WO   WO-2010025994 A1 * 3/2010 .......... G06F 11/3442

OTHER PUBLICATIONS

[No Author Listed], "With the P4/C system For SmartNIC firmware development Commitment," FUJITSU Advanced Technologies Limited, 2017, 51 pages (with English Translation).
(Continued)

*Primary Examiner* — John H Le
(74) *Attorney, Agent, or Firm* — Fish & Richardson P.C.

(57) ABSTRACT

A storage unit stores statistical information including an amount of resource consumption and performance information, which represents a performance, of each piece of hardware of a plurality of types that are candidates for an arrangement destination of a function, an accepting unit accepts inputs of description details of a function in a high-level language corresponding to the hardware of the plurality of types, and a performance requirement that represents a required performance, a performance predicting unit calculates a predicted performance, and a predicted amount of resource consumption, using the description details and a predetermined algorithm for each piece of hardware; and a device selecting unit selects, as an arrangement destination, hardware with the calculated predicted performance and the performance information satisfying the performance requirement and a total value of the predicted
(Continued)

amount of resource consumption and the amount of resource consumption being equal to or smaller than a resource capacity.

4 Claims, 6 Drawing Sheets

(58) Field of Classification Search
USPC .......................................................... 702/186
See application file for complete search history.

(56) References Cited

OTHER PUBLICATIONS

Bosshart et al., "P4: Programming Protocol-Independent Packet Processors," ACM SIGCOMM Computer Communication Review, Jul. 2014, 44(3):88-95.

Stubbe, "P4 Compiler & Interpreter: A Survey," Proc. Future Internet (FI) Innov. Internet Technol. Mobile Commun. (IITM), 2017, 47:47-52.

Zazo et al., "A PCIe DMA engine to support the virtualization of 40 Gbps FPGA-accelerated network appliances," International Conference on ReConFigurable Computing and FPGAs, Dec. 7, 2015, 6 pages.

* cited by examiner

| DEVICE | CPU | FPGA1 | FPGA2 | ... |
|---|---|---|---|---|
| AMOUNT OF RESOURCE CONSUMPTION | 80% | 10% | 0% | ... |
| THROUGHPUT | 1Gbps | 40Gbps | - | ... |
| DELAY | 100ms | 1ms | - | ... |
| ... | ... | ... | ... | ... |
| STATUS | OPERATING | OPERATING | OPERATING | |
| USE FUNCTION | FUNCTION A (20%) FUNCTION B (60%) | FUNCTION A (10%) | | |

14a

DETAILS OF AMOUNT OF RESOURCE CONSUMPTION

| DEVICE | CPU | | FPGA1 |
|---|---|---|---|
| NUMBER OF CORES | 16 | NUMBER OF FFs | 50000 |
| NUMBER OF CORES IN USE | 10 | FF USE AMOUNT | 5000 |
| NUMBER OF MEMORIES | 1TB | LUT USE AMOUNT | 50000 |
| MEMORY USE AMOUNT | 800GB | LUT USE AMOUNT | 5000 |
| ... | ... | ... | ... |

Fig. 3

INSTALLATION DEVICE AND INSTALLATION METHOD

CROSS-REFERENCE TO RELATED APPLICATIONS

This application is a National Stage application under 35 U.S.C. § 371 of International Application No. PCT/JP2019/020775, having an International Filing Date of May 24, 2019, which claims priority to Japanese Application Serial No. 2018-108254, filed on Jun. 6, 2018. The disclosure of the prior application is considered part of the disclosure of this application, and is incorporated in its entirety into this application.

TECHNICAL FIELD

The present invention relates to an arrangement device and an arrangement method.

BACKGROUND ART

In a carrier network, a packet processing load of a Central Processing Unit (CPU) of a server increases in accordance with an increase in the traffic. Thus, for the off-load of the CPU load of the server, a technology for distributing the processing of a network function (hereinafter, simply referred to as a function as well) by combining an accelerator of a hardware type different from that of the CPU with the server is known (see Non Patent Literature 1). In this way, technologies for improving the performance of the entire system by combining hardware (hereinafter, also referred to as "devices") are studied.

In such a case, the technique for implementing characteristics of the architecture of the system and the network function differs in accordance with a hardware processor used for the accelerator. Therefore, in order to conceal such a difference and efficiently develop functions, a high-level language such as P4 that is a hardware description language that corresponds to a plurality of types of devices by raising the abstraction degree is proposed (see Non Patent Literatures 2 to 4).

In addition, when the accelerator is occupied by one network function, resources are wasted, and thus, a plurality of functions may be arranged in the accelerator. In order to improve the performance of the entire system, a system configuration including a combination of a plurality of types of hardware is required.

CITATION LIST

Non Patent Literature

Non Patent Literature 1: J. F. Zazo, et al., "A PCIe DMA engine to support the virtualization of 40 Gbps FPGA-accelerated network appliances", in Reconfigurable Computing and FPGAs, pp. 1-6, 2015
Non Patent Literature 2: "Initiatives for development of SmartNIC firmware using P4/C", [online], 2017, Fujitsu, [retrieved on May 11, 2018], Internet <URL:https://www.okinawaopenlabs.com/ood/2017/wp-content/uploads/sites/4/2017/12/fujitsu_3.pdf>
Non Patent Literature 3: P. Bosshart, et al., "P4: Programming Protocol-Independent Packet Processors", SIGCOMM CCR, vol. 44, no. 3, pp. 87-95, 2014 Non Patent Literature 4: Henning Stubbe, "P4 Compiler & Interpreter: A Survey", Proc. Future Internet (FI) Innov. Internet Technol. Mobile Commun. (IITM). Vol. 47, pp. 47-52, 2017

SUMMARY OF THE INVENTION

Technical Problem

However, in the related art, in a case that a network function is implemented using a plurality of types of hardware, the processing performance and a consumed resource capacity are checked by executing a simulation and operation checking that are different for each piece of hardware. For this reason, a long time is required for the simulation and the operation checking, which prevents quick arrangement of the network function. As a result, resources may be wasted.

The present invention is made in view of the foregoing, and an object thereof is to quickly arrange a network function in a plurality of types of hardware.

Means for Solving the Problem

In order to solve the problems described above and achieve the object, an arrangement device according to the present invention includes: a storage unit configured to store statistical information including an amount of resource consumption and performance information, which represents a performance, of each piece of hardware of a plurality of types that are candidates for an arrangement destination of a function; an accepting unit configured to accept inputs of description details of a function in a high-level language, which is a hardware description language corresponding to the hardware of the plurality of types, and a performance requirement that represents a required performance; a prediction unit configured to calculate a predicted performance, which is a performance that is predicted, and a predicted amount of resource consumption, which is an amount of resource consumption that is predicted, using the description details and a predetermined algorithm for each piece of hardware; and a selection unit configured to select, as an arrangement destination, hardware with the calculated predicted performance and the performance information satisfying the performance requirement and a total value of the predicted amount of resource consumption and the amount of resource consumption being equal to or smaller than a resource capacity.

Effects of the Invention

According to the present invention, a network function can be arranged quickly in a plurality of types of hardware.

BRIEF DESCRIPTION OF DRAWINGS

FIG. 3 is a diagram illustrating a data configuration of statistical information.

DESCRIPTION OF EMBODIMENTS

Hereinafter, an embodiment of the present invention will be described in detail with reference to the drawings. Note that the present invention is not limited by the embodiment. Also, components which are the same in the description of the drawings are denoted by the same reference signs.

Target System

Figure 1:
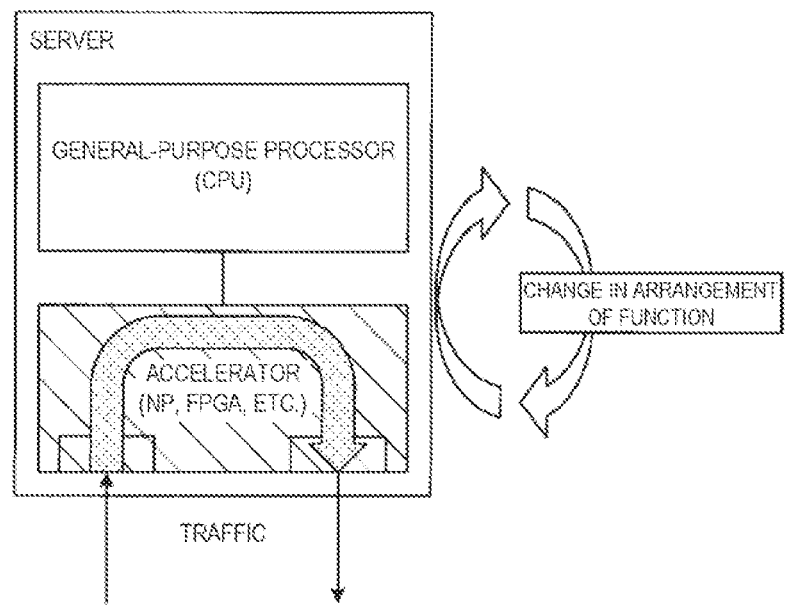
FIG. 1 is an explanatory diagram illustrating a target system of an arrangement device according to the embodiment.

FIG. 1 is an explanatory diagram illustrating a target system of an arrangement device according to this embodiment. As illustrated in FIG. 1, a system that is a target for an arrangement processing using the arrangement device is configured by building an accelerator into a server. The accelerator is implemented using a type of hardware different from a CPU of the server such as a Network Processor (NP) or a Field Programmable Gate Array (FPGA).

In this system, traffic of packets received by the accelerator from other network devices on a communication network is allocated to the accelerator or the CPU of the server in accordance with processing requested for the packets. A network function that becomes a load factor for the CPU of the server is located in the accelerator. As a result, the CPU load of the server can be offloaded to the accelerator.

The arrangement device according to this embodiment executes arrangement processing for determining the hardware where each of the network functions is arranged from among the CPU and the accelerator in such a system.

Configuration of Arrangement Device

Figure 2:
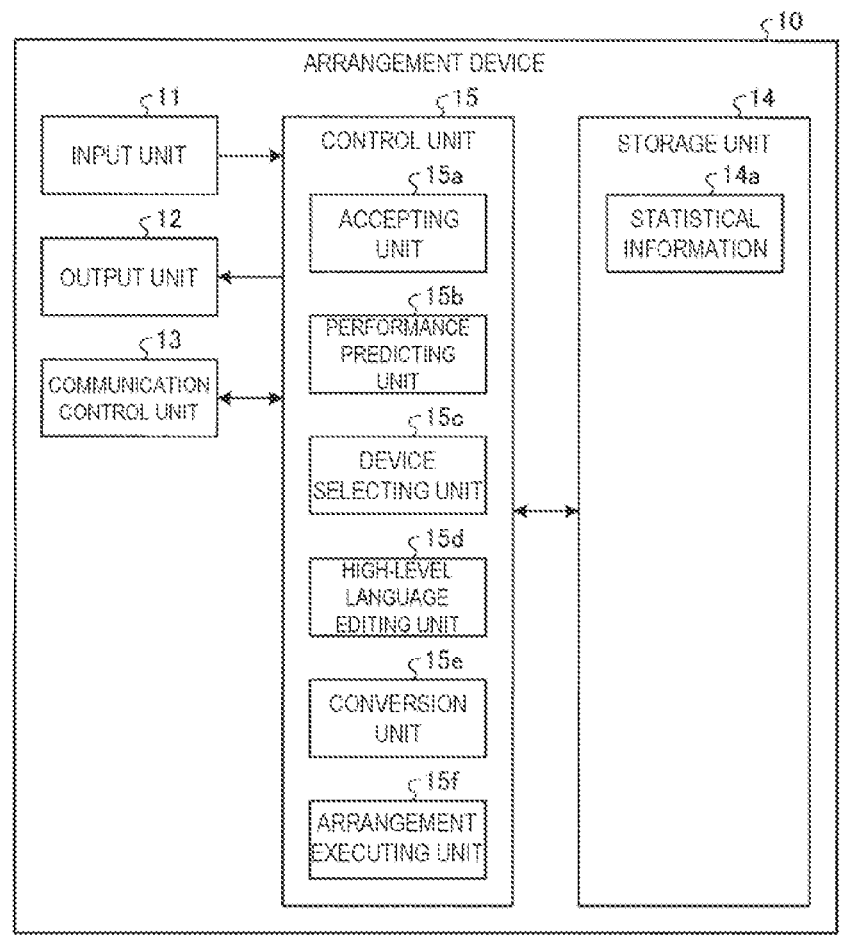
FIG. 2 is a schematic view illustrating an example of a schematic configuration of the arrangement device.

FIG. 2 is a schematic view illustrating an example of a schematic configuration of an arrangement device 10. As illustrated in FIG. 2, the arrangement device 10 according to the embodiment is implemented by a general-purpose computer such as a work station or a personal computer and includes an input unit 11, an output unit 12, a communication control unit 13, a storage unit 14, and a control unit 15.

The input unit 11 is implemented using an input device such as a keyboard or a mouse, and inputs various kinds of instruction information, such as starting of processing, to the control unit 15 in response to the operator's input operation. The output unit 12 is implemented using a display device such as a liquid crystal display, a printing device such as a printer, an information communication apparatus, and the like. The communication control unit 13 controls communication with external devices such as network devices through a telecommunication line such as a local area network (LAN) or the Internet. For example, the communication control unit 13 receives a measurement value and the like of a performance of hardware such as a CPU, an NP, or an FPGA from the system that is a target for arrangement processing illustrated in FIG. 1.

The storage unit 14 is realized by a semiconductor memory device such as a Random Access Memory (RAM) or a Flash Memory or a storage device such as a hard disk or an optical disc. The storage unit 14 may be configured to communicate with the control unit 15 through a telecommunication line such as a LAN or the Internet.

In this embodiment, statistical information 14a is stored in the storage unit 14. This statistical information 14a includes an amount of resource consumption and performance information representing a performance of each of pieces of hardware of a plurality of types that are candidates for an arrangement destination of a function.

Here. FIG. 3 illustrates the data configuration of the statistical information 14a. As illustrated in FIG. 3, the statistical information 14a includes an amount of resource consumption and performance information of each device. In FIG. 3, a CPU, an FPGA1, an FPGA2, and the like are illustrated as the devices.

An amount of resource consumption is an actual value that is represented by a use rate (%) or the like of each device. In the example illustrated in FIG. 3, the amount of resource consumption further includes detailed information that is different for each device. For example, the number of cores, the number of cores in use, the number of memories, an amount of memory usage, and the like are included in the amount of resource consumption of the CPU illustrated in FIG. 3, and the number of flipflops (FFs), an amount of use of FFs, the number of lookup tables (LUTs), an amount of use of LUTs, and the like are included in the amount of resource consumption of the FPGA1.

The performance information is an actual value including a throughput (Gbps), a delay (ms), and the like. Here, the throughput is an amount of data that can be processed by each device within a predetermined time. For example, the delay is represented by a time from a time at which a packet is transmitted to a time until an ACK packet is received by a transmission side after a reception side transmits the ACK packet to the transmission side.

In addition, the statistical information 14a includes a status and a use function. The status is information that indicates whether each device can be used and is represented as "operating" or "failure". The arrangement device 10 selects a device of which the status is "operating" as a target for an arrangement destination of the network function in arrangement processing, which will be described below.

The use function is represented by a function arranged in each device and an actual value of the amount of resource consumption according to each function. In the arrangement processing to be described below, the arrangement device 10 converts a source code of a high-level language into a source code of a device selected as an arrangement destination of a network function, measures an amount of resource consumption of the function using the converted source code, and updates the statistical information 14a using this measured value as an actual value. The "amount of resource consumption" described above corresponds to a total value of the amounts of resource consumption of all the "use functions" arranged in devices.

Description will be made with reference to FIG. 2 again. The control unit 15 is implemented by a CPU and the like, executes a processing program stored in a memory, and, as illustrated in FIG. 2. functions as an accepting unit 15a, a performance predicting unit 15b, a device selecting unit 15c, a high-level language editing unit 15d, a conversion unit 15e, and an arrangement executing unit 15f.

The accepting unit 15a accepts inputs of description details of a function using a high-level language that is a hardware description language corresponding to hardware of a plurality of types and performance requirements representing a required performance. More specifically, the accepting unit 15a accepts inputs of a source code, which is described in a high-level language, of a function as a target for the arrangement processing and performance requirements that are requirement conditions of performance such as a throughput, a delay, and the like through the input unit 11 or the communication control unit 13.

The performance predicting unit 15b functions as a prediction unit. In other words the performance predicting unit 15b calculates, for each piece of hardware, a predicted performance that is a predicted processing performance and a predicted amount of resource consumption that is a predicted amount of resource consumption by using the description details of the high-level language and a predetermined algorithm.

In addition, the performance predicting unit 15b generates an algorithm through learning using the description details of the high-level language and an amount of resource consumption and performance information measured for the function corresponding to these description details.

More specifically, the performance predicting unit 15b learns a relation between the source code in the high-level language and the amount of resource consumption and the performance information of each piece of hardware by using the source code in the high-level language of a function and the amount of resource consumption and the performance information included in the statistical information 14a as actual values for this function. As a result, the performance predicting unit 15b generates an algorithm for calculating a relation between the source code in the high-level language and the amount of resource consumption and the performance information of each piece of hardware. The performance predicting unit 15b stores the generated algorithm in the storage unit 14.

Then, the performance predicting unit 15b calculates, by applying the generated algorithm to each piece of hardware, a performance that is predicted, that is, a predicted performance and an amount of resource consumption that is predicted, that is, a predicted amount of resource consumption from the source code of the high-level language of a function that is input as a target for the arrangement processing.

The device selecting unit 15c functions as a selection unit. In other words, the device selecting unit 15c selects, as an arrangement destination, hardware with the calculated predicted performance and the performance information satisfying performance requirements and a total value of the predicted amount of resource consumption and the amount of resource consumption being equal to or smaller than a resource capacity.

More specifically, the device selecting unit 15c compares, for each piece of hardware, input performance requirements, a predictive performance that has been calculated, and the performance information included in the statistical information 14a on the hardware. Then, in a case that both the predicted performance and the performance information satisfy the performance requirements, the device selecting unit 15c sets this hardware as a candidate for an arrangement destination.

Next, the device selecting unit 15c calculates a total value of the calculated predicted amount of resource consumption and the amount of resource consumption included in the statistical information 14a. Then, in a case that the calculated total value is equal to or smaller than the resource capacity of the hardware, the device selecting unit 15c selects this hardware as an arrangement destination of the function.

Figure 4:
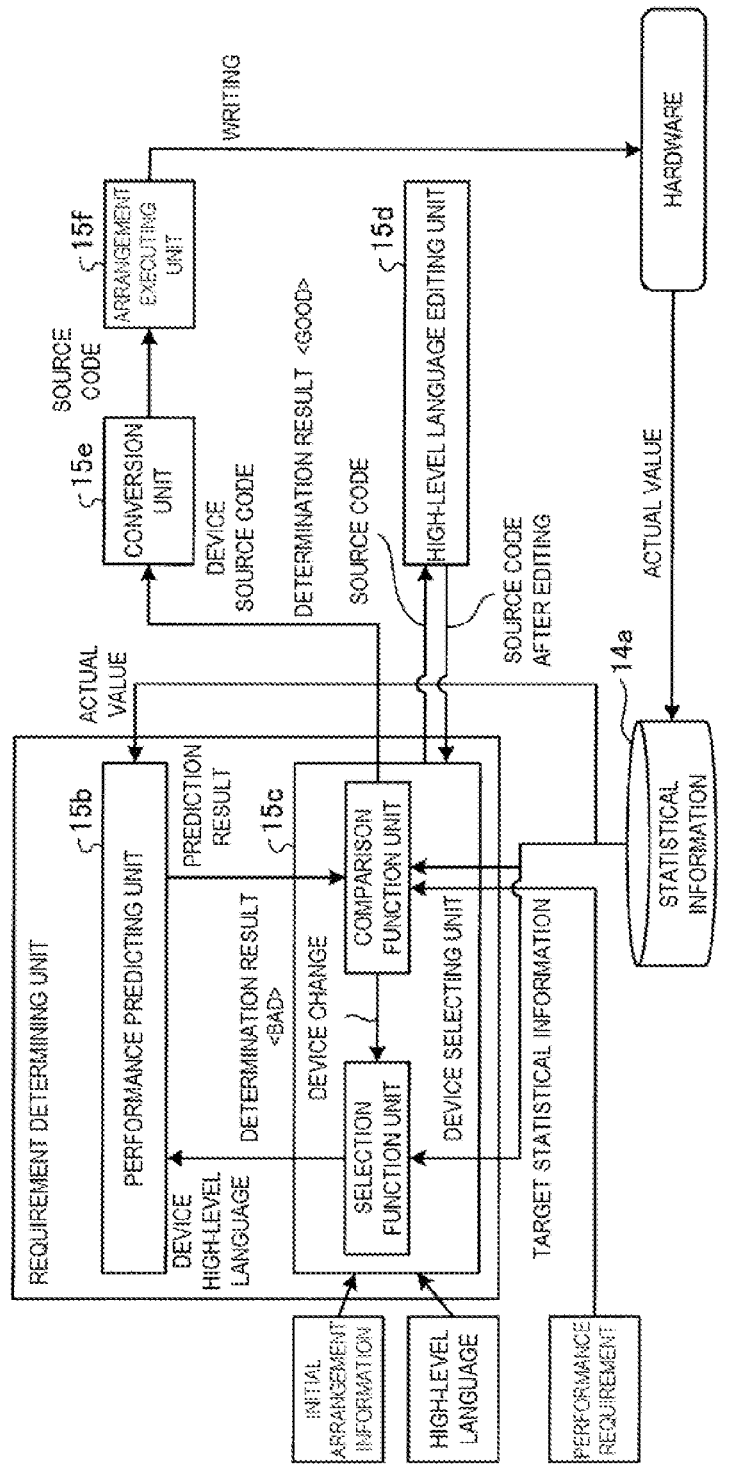
FIG. 4 is an explanatory diagram illustrating processing of an arrangement device.

Here, FIG. 4 illustrates the processing of the arrangement device 10. In the example illustrated in FIG. 4, the device selecting unit 15c includes a selection function unit and a comparison function unit. The selection function unit sequentially designates, for the performance predicting unit 15b, each of devices that are targets for the processing of determining whether the device is appropriate as an arrangement destination of the function. In this case, first, the selection function unit refers to the initial arrangement information that is input through the input unit 11 or the communication control unit 13 and is stored in the storage unit 14 in advance, and notifies the device selecting unit 15c of a device designated in initial arrangement information as the first target device.

In addition, the selection function unit of the device selecting unit 15c functions as the accepting unit 15a and accepts a source code, in the high-level language, of the function input as a target for arrangement processing and transmits the accepted source code to the performance predicting unit 15b.

The performance predicting unit 15b calculates a predicted performance and a predicted amount of resource consumption of the designated device using the source code in the high-level language and the algorithm and transmits the predicted performance and the predicted amount of resource consumption, as a prediction result, to the comparison function unit of the device selecting unit 15c. This algorithm is generated, by the performance predicting unit 15b in advance using the source code of the high-level language of the function and the amount of resource consumption and the performance information included in the statistical information 14a as actual values for this function.

The comparison function unit of the device selecting unit 15c functions as the accepting unit 15a and accepts performance requirements. The comparison function unit compares the input performance requirements, the prediction result, and the performance information and the amount of resource consumption included in the statistical information 14a of this device.

In a case that the calculated predicted performance and the performance information satisfy the performance requirements, and a total value of the predicted amount of resource consumption and the amount of resource consumption of the device is within the range of the resource capacity of this device, the comparison function unit gives a determination result "Good" and selects this device as an arrangement destination.

In a case that the determination result is not "Good", the comparison function unit gives determination result "Bad", and instructs the selection function unit to change the target device. In this way, the selection function unit sequentially designates, for the performance predicting unit 15b, target devices for an arrangement destination of the arrangement processing. The designation order of target devices is not particularly limited, and, for example, the target devices may be designated in ascending order of the amount of resource consumption, that is, descending order of allowed resources that is acquired by subtracting an amount of resource consumption of the device from the resource capacity of the device.

In a case that the input performance requirements are a delay of 5 ms, and a throughput of 10 Gbps, and when the target device is a CPU, the delay is 100 ms and the throughput is 1 Gbps according to the statistical information 14a illustrated in FIG. 3, and the performance requirements are not satisfied. Thus, the comparison function unit gives a determination result of "Bad" and instructs the selection function unit to change the target device.

Thus, the selection function unit changes the target device to the FPGA1. In this case, the FPGA1 has a delay of 1 ms and a throughput of 40 Gbps according to the statistical information 14a, and the performance requirements are satisfied. Thus, in a case that the predicted performance satisfies the performance requirements, and a total value of the predicted amount of resource consumption and the amount of resource consumption is equal to or smaller than a resource capacity of the device, the selection function unit determines the FPGA1 as an arrangement destination of the function.

For example, in a case that the amount of resource consumption of the FPGA1 is 10%, the predicted amount of resource consumption is 20%, and the resource capacity is 100%, a total of the predicted amount of resource consumption and the amount of resource consumption is equal to or smaller than the resource capacity, and therefore, the FGPA1 is determined as the arrangement destination. In this case, the amount of resource consumption of the FPGA1 after arrangement is 30%. In this case, the amount of resource consumption of the CPU does not change.

In addition, the comparison function unit of the device selecting unit 15c further refers to the status of the statistical information 14a, checks that the target device has not failed and then determines the device as an arrangement destination.

In this way, the arrangement device 10 can predict an amount of resource consumed by the function and the performance information using the source code in the high-level language of the function that is an arrangement target. For this reason, hardware of an arrangement destination of a function can be selected quickly and appropriately without executing operation checking using a simulation or a real machine.

Description will be made with reference to FIG. 2 again. The high-level language editing unit 15d functions as an editing unit. In other words, the high-level language editing unit 15d divides the description details in the high-level language in a case that an amount of allowed resources, which is a value acquired by subtracting the amount of resource consumption from the resource capacity of the hardware, is smaller than the predicted amount of resource consumption. In addition, the high-level language editing unit 15d combines description details in the high-level language of a plurality of functions within the range of the amount of allowed resources in a case that the amount of allowed resources is larger than the predicted amount of resource consumption.

The conversion unit 15e converts the source code in the high-level language of the function into a source code corresponding to the hardware. The arrangement executing unit 15f measures statistical information by using the source code corresponding to the hardware.

More specifically, for example, as illustrated in FIG. 4, in a case that a determination result acquired by the comparison function unit is "Bad", the high-level language editing unit 15d performs editing such as dividing using the source code in the high-level language of the function that is a target of the arrangement processing or combining with a source code of another function. In addition, the high-level language editing unit 15d delivers the source code after editing to the device selecting unit 15c. In this case, the device selecting unit 15c changes the target of the arrangement processing to the function described in the source code after editing and performs subsequent processing.

In a case that the device that is the arrangement destination of the function is determined by the arrangement processing described above, the conversion unit 15e converts the source code in the high-level language of the function received from the device selecting unit 15c into a source code of the determined device and delivers the converted source code to the arrangement executing unit 15f.

The arrangement executing unit 15f executes operation checking in the simulation of the function or the actual machine using the source code converted by the conversion unit 15e. Then, the arrangement executing unit 15f measures an amount of resource consumption of the function and updates the statistical information 14a using this measured value as an actual value. In other words, the "use function" and the "amount of resource consumption" of the statistical information 14a are updated using an amount of the resource consumption of the function after the arrangement.

An algorithm used by the performance predicting unit 15b for predicting the performance is generated using this updated statistical information 14a, and the algorithm of the storage unit 14 is updated. As a result, the accuracy of the algorithm is improved.

Arrangement Process

Figure 5:
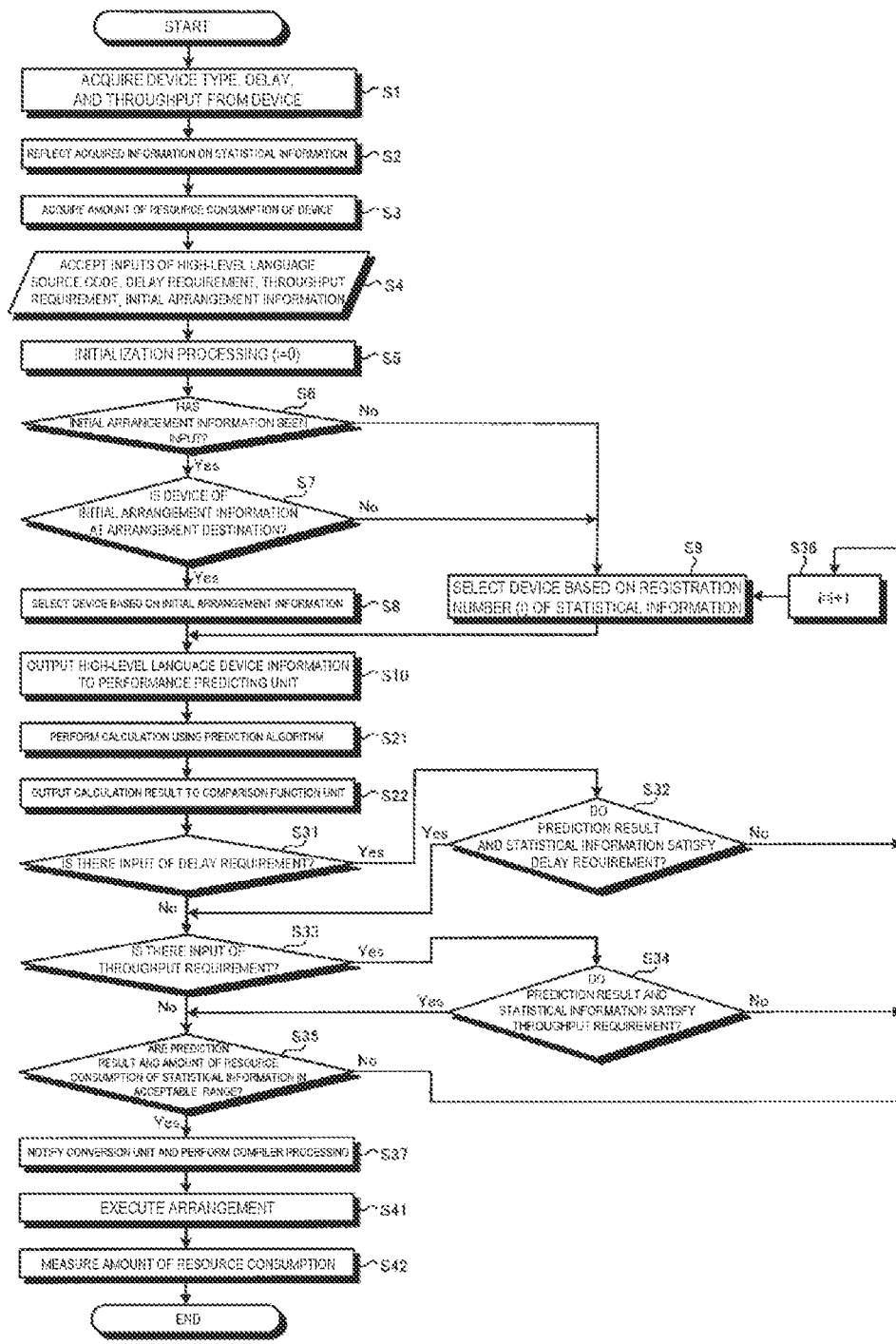
FIG. 5 is a flowchart illustrating the sequence of an arrangement processing.

Next, the arrangement processing using the arrangement device according to this embodiment will be described with reference to FIG. 5. FIG. 5 is a flowchart illustrating the sequence of the arrangement process. For example, the flowchart illustrated in FIG. 5 is started at a timing when the user gives the instruction of start.

First, the arrangement device acquires, from each of devices, performance information such as a type, a delay, and a throughput of the device (step S1) and stores the acquired performance information in the storage unit 14 as the statistical information 14a (step S2). In addition, the arrangement device acquires an amount of resource consumption of each device (step S3).

Next, the accepting unit 15a accepts inputs of the source code of the high-level language of the function that is a target for the arrangement processing and the performance requirement (step S4). In this embodiment, the accepting unit 15a accepts inputs of a delay requirement and a throughput requirement as performance requirements. In addition, the accepting unit 15a accepts an input of initial arrangement information, which is an initial value of the device that is a target of the arrangement processing and performs an initialization processing (i=0) for a registration number i (here, i=0, 1, . . . ), which is used for identifying a device, of the statistical information 14a (Steps S4 to S5).

Next, the selection function unit of the device selecting unit 15c checks that the initial arrangement information has been input (step S6) and if the initial arrangement information has been input (Yes in step S6), checks that the device of the initial arrangement information is present as an arrangement destination (step S7). If the device of the initial arrangement information is present as the arrangement destination (Yes in step S7), the selection function unit selects the device as the target device for the arrangement processing (step S8).

On the other hand, if the initial arrangement information has not been input (step S6, No) or the device of the initial arrangement information is not present as the arrangement destination (No in step S7), the selection function unit selects a target device for the arrangement processing based on the registration number i of the statistical information 14a (step S9).

The selection function unit transmits information designating the selected device and the source code in the high-level language to the performance predicting unit 15b (step S10). In the case, the performance predicting unit 15b calculates a predicted amount of resource consumption and predicted a performance (step S21) and outputs the calculated prediction result to the comparison function unit of the device selecting unit 15c (step S22). In this embodiment, predicted values of the delay and the throughput, as a predicted performance, are output to the comparison function unit in correspondence with the performance requirement.

The comparison function unit checks that performance requirements have been input. The comparison function unit, first, checks that a delay requirement has been input (step S31) and, if the delay requirement has been input (Yes in step S31), checks whether the prediction result and the delay of the statistical information 14a satisfy the delay requirement (step S32). The comparison function unit, if the prediction result and the delay of the statistical information 14a satisfy the delay requirement (Yes in step S32), proceeds to processing of step S33 and if the delay requirement is not satisfied (No in step S32), proceeds to processing of step S36.

In the processing of step S33, the comparison function unit checks that a throughput requirement has been input, and if the throughput requirement has been input (Yes in step S33), checks whether the predicted result and the throughput of the statistical information 14a satisfy the throughput requirement (step S34). The comparison function unit, if the prediction result and the throughput of the statistical information 14a satisfy the throughput requirement (Yes in step S34), proceeds to processing of step S35 and if the throughput requirement is not satisfied (No in step S34) proceeds to processing of step S36.

In the processing of step S35, the comparison function unit checks whether a total value of the predicted amount of resource consumption of the prediction result and the amount of resource consumption of the statistical information 14a is in an acceptable range that is equal to or smaller than the resource capacity of the device. The comparison function unit, if the total value is not in the acceptable range (No in step S35), proceeds to processing of step S36 and, if the total value is in the acceptable range (Yes in step S35), selects this device as an arrangement destination of the function and proceeds to processing of step S37.

In the processing of step S36, the comparison function unit increments the registration number i used for identifying the device of the statistical information 14a and returns to the processing of step S9.

In the processing of step S37, the comparison function unit notifies the conversion unit 1e of the device selected as the arrangement destination of the function and the source code in the high-level language, and instructs the execution of a compiler processing (step S37).

The conversion unit 15e executes the compiler processing of converting the source code in the high-level language to the source code of the device that is the arrangement destination, and delivers the converted source code to the arrangement executing unit 15f. The arrangement executing unit 15f arranges the compiler-processed function in the device (step S41), measures an amount of resource consumption of the arranged function (step S42), and updates the statistical information 14a using this measured value as an actual value. In this way, a series of arrangement processes ends.

As described above, in the arrangement device 10 according to this embodiment, the storage unit 14 stores the statistical information 14a that includes an amount of resource consumption and performance information indicating a performance of each piece of hardware of a plurality of types that are candidates for an arrangement destination of the function. The accepting unit 15a accepts inputs of description details of the function in the high-level language, which is a hardware description language corresponding to the hardware of a plurality of types and a performance requirement that represents a required performance. The performance predicting unit 15b calculates, for each piece of hardware, a predicted performance, which is a performance that is predicted, and a predicted amount of resource consumption, which is an amount of resource consumption that is predicted, using the description details described above and a predetermined algorithm. In addition, the device selecting unit 15c selects, as an arrangement destination, hardware with the calculated predicted performance and the performance information included in the statistical information 14a satisfying a performance requirement and a total value of the calculated predicted amount of resource consumption and the amount of resource consumption included in the statistical information 14a being equal to or smaller than the resource capacity.

In accordance with this, the arrangement device 10 can predict an amount of resource consumption by the function and performance information using a source code in the high-level language of the function that is an arrangement target. For this reason, hardware as an arrangement destination of a function can be selected quickly and appropriately without executing operation checking using a simulation or a real machine. Therefore, according to the arrangement processing of the arrangement device 10, a network function can be arranged quickly in hardware of a plurality of types.

The performance predicting unit 15b generates an algorithm through learning using the description details in the high-level language and the amount of resource consumption and the performance information measured in correspondence with the description details. As a result, the accuracy of the algorithm used for predicting the performance is improved.

The high-level language editing unit 15d divides description details in the high-level language in a case that an amount of allowed resources, which is a value obtained by subtracting an amount of resource consumption from a resource capacity of the hardware, is smaller than a predicted amount of resource consumption and combines description details of a plurality of functions in the high level-language in the range of the amount of allowed resources in a case that the amount of allowed resources is larger than the predicted amount of resource consumption. As a result, the network function can be arranged more appropriately.

Program

A program in which the processing executed by the arrangement device 10 according to the embodiment described above is described in a computer-executable language can be created as well. As one embodiment, the arrangement device 10 can be implemented by installing an arrangement program for executing the arrangement processing described above in a desired computer as packaged software or on-line software. For example, by causing an information processing apparatus to execute the arrangement program described above, the information processing apparatus can be configured to function as the arrangement device 10. The information processing apparatus described here includes a desktop or laptop personal computer. In addition, a mobile communication terminal such as a smart phone, a mobile phone, or a Personal Handyphone System (PHS) and a slate terminal such as a Personal Digital Assistant (PDA) are included in the category of the information processing apparatus.

In addition, the arrangement device 10 can be implemented as a server apparatus that has a terminal apparatus used by a user as a client and provides services regarding the arrangement processing described above to the client. For example, the arrangement device 10 is implemented as a server apparatus that provides an arrangement processing service receiving, as inputs, performance requirements and a source code of the function in a high-level language and outputting hardware that is an arrangement destination of the function. In this case, the arrangement device 10 may be implemented as a web server or may be implemented as a cloud configured to provide services relating to arrangement processing described above through outsourcing. Hereinafter, one example of a computer that executes an arrangement program implementing functions that are similar to those of the arrangement device 10 will be described.

Figure 6:
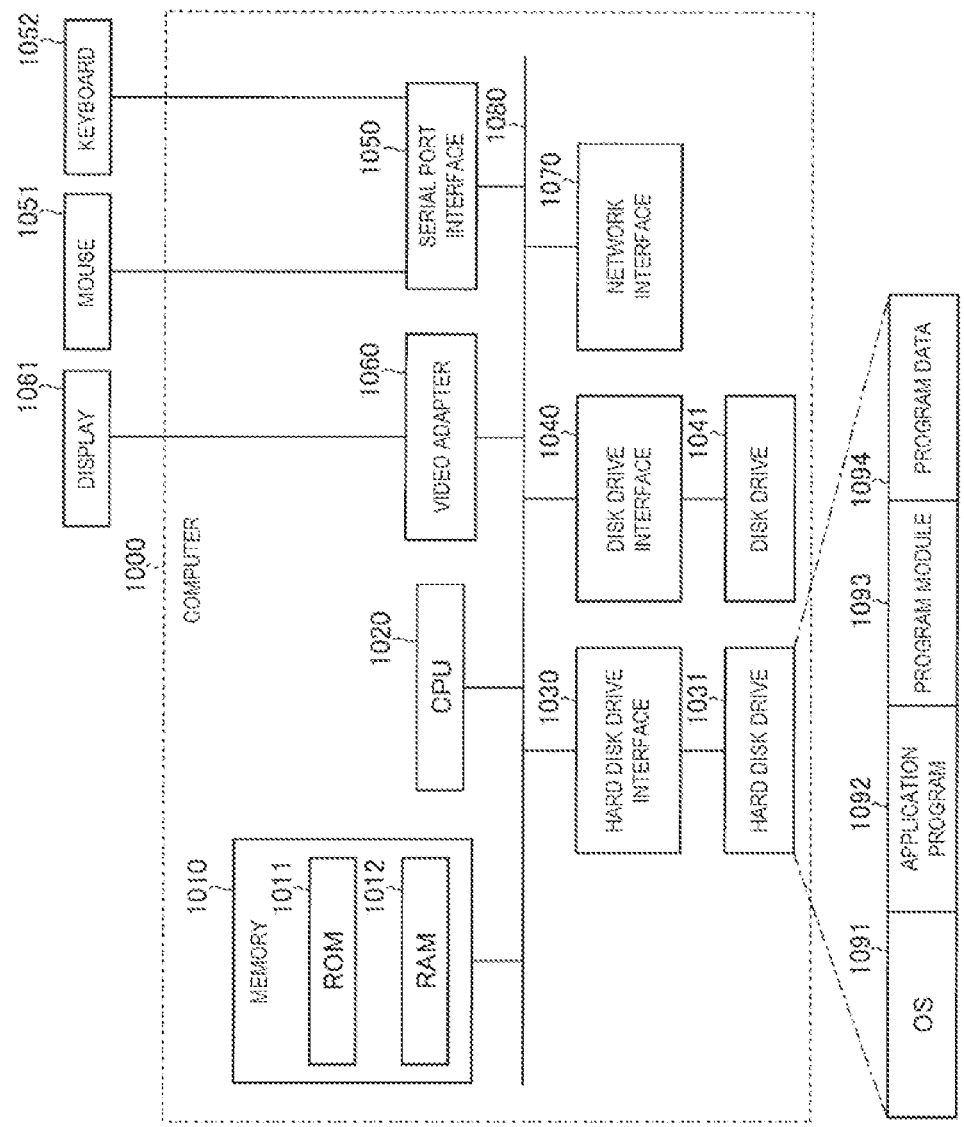
FIG. 6 is a diagram illustrating a computer that executes an arrangement program.

FIG. 6 is a diagram illustrating an example of a computer that executes the arrangement program. A computer 1000 has, for example, a memory 1010, a CPU 1020, a hard disk drive interface 1030, a disk drive interface 1040, a serial port interface 1050, a video adapter 1060, and a network interface 1070. These units are connected by a bus 1080.

The memory 1010 includes Read Only Memory (ROM) 1011 and a RAM 1012. The ROM 1011 stores a boot program, such as Basic Input Output System (BIOS), for example. The hard disk drive interface 1030 is connected to the hard disk drive 1031. The disk drive interface 1040 is connected to a disk drive 1041. A detachable storage medium such as a magnetic disk or an optical disc, for example, is inserted into the disk drive 1041. A mouse 1051 and a keyboard 1052, for example, are connected to the serial port interface 1050. A display 1061, for example, is connected to the video adapter 1060.

Here, the hard disk drive 1031 stores, for example, an OS 1091, an application program 1092, a program module 1093, and program data 1094. The respective information described in the aforementioned embodiments are stored in, for example, the hard disk drive 1031 and the memory 1010.

In addition, the arrangement program, for example, is stored in a hard disk drive 1031 as a program module 1093 in which commands to be executed by the computer 1000 are described. More specifically, the program module 1093 in which each processing executed by the arrangement device 10 described in the embodiment is described is stored in the hard disk drive 1031.

Data used in information processing according to the arrangement program is stored, for example, in the hard disk drive 1031 as program data 1094. Then, the CPU 1020 reads the program module 1093 and the program data 1094 stored in the hard disk drive 1031 as needed in the RAM 1012 and executes each of the aforementioned procedures.

The program module 1093 or the program data 1094 relating to the arrangement program is not necessarily stored in the hard disk drive 1031 and, for example, may be stored in a detachable storage medium and be read by the CPU 1020 through the disk drive 1041 or the like. Alternatively, the program module 1093 or the program data 1094 relating to the arrangement program may be stored in another computer connected via a network such as Local Area Network (LAN) or a Wide Area Network (WAN) and be read by the CPU 1020 through the network interface 1070.

Although the embodiments to which the invention made by the present inventors is applied have been described above, the invention is not limited by the description and the drawings as a part of the disclosure of the present invention according to the embodiments. In other words, all of other embodiments, examples, operation technologies, and the like made by those skilled in the art based on the embodiments are within the scope of the invention.

REFERENCE SIGNS LIST

10 Arrangement device
11 Input unit
12 Output unit
13 Communication control unit
14 Storage unit
14*a* Statistical information
15 Control unit
15*a* Accepting unit
15*b* Performance predicting unit
15*c* Device selecting unit
15*d* High-level language Editing unit
15*e* Conversion unit
15*f* Arrangement execution unit

The invention claimed is:

1. An arrangement device comprising:
a storage unit configured to store statistical information including an amount of resource consumption and performance information, which represents a performance, of each piece of hardware of a plurality of types that are candidates for an arrangement destination of a function;
an accepting unit configured to accept inputs of description details of a function in a high-level language, which is a hardware description language corresponding to the piece of hardware of the plurality of types, and a performance requirement that represents a required performance;
a prediction unit configured to calculate a predicted performance and a predicted amount of resource consumption using the description details and a predetermined algorithm for each piece of hardware; and
a selection unit configured to select, as an arrangement destination, hardware with the calculated predicted performance and the performance information satisfying the performance requirement and a total value of the predicted amount of resource consumption and the amount of resource consumption being equal to or smaller than a resource capacity.

2. The arrangement device according to claim 1, wherein the prediction unit generates the predetermined algorithm further through learning using the description details and the amount of resource consumption and the performance information measured for a function corresponding to the description details.

3. The arrangement device according to claim 1, further comprising an editing unit configured to:
divide the description details in a case in which an amount of allowed resources that is a value acquired by subtracting the amount of resource consumption from a resource capacity of the hardware is smaller than the predicted amount of resource consumption, and
combine the description details of a plurality of functions in a range of the amount of allowed resources in a case that the amount of allowed resources is larger than the predicted amount of resource consumption.

4. An arrangement method executed by an arrangement device including a storage unit for storing statistical information including an amount of resource consumption and performance information, which represents a performance, of each piece of hardware of a plurality of types that are candidates for an arrangement destination of a function, the arrangement method comprising:

accepting inputs of description details of a function in a high-level language, which is a hardware description language corresponding to the piece of hardware of the plurality of types, and a performance requirement that represents a required performance;

calculating a predicted performance and a predicted amount of resource consumption using the description details and a predetermined algorithm for each piece of hardware; and selecting, as an arrangement destination, hardware with the calculated predicted performance and the performance information satisfying the performance requirement and a total value of the predicted amount of resource consumption and the amount of resource consumption being equal to or smaller than a resource capacity.

* * * * *